United States Patent [19]

Hawkswell

[11] Patent Number: 4,995,662
[45] Date of Patent: Feb. 26, 1991

[54] SUCTION PICK-UP APPARATUS FOR ELECTRICAL OR ELECTRONIC COMPONENTS

[75] Inventor: Victor T. Hawkswell, Essex, England

[73] Assignee: Emhart Industries, Inc., Hartford, Conn.

[21] Appl. No.: 376,773

[22] Filed: Jul. 7, 1989

Related U.S. Application Data

[63] Continuation of Ser. No. 207,362, Jun. 15, 1988, Pat. No. 4,852,247.

[30] Foreign Application Priority Data

Jun. 17, 1987 [GB] United Kingdom ................. 8714175

[51] Int. Cl.$^5$ .......................... H05K 3/30; B25J 15/06; B65G 47/91
[52] U.S. Cl. ..................................... 294/64.1; 29/740; 29/743
[58] Field of Search ................. 29/740, 743, 741, 759; 294/2, 64.1; 414/744 B

[56] References Cited

U.S. PATENT DOCUMENTS 4,762,354 8/1988 Gfeller et al. ..................... 29/743 X
4,815,779 3/1989 Glessner et al. .................. 29/743 X Primary Examiner—Carl E. Hall
Attorney, Agent, or Firm—Spencer T. Smith

[57] ABSTRACT

A pick-up head (10) of the apparatus has three alternative pick-up surfaces (24,34,64) formed respectively on a body (16), a first piston member (30), and a second piston member (60). The first piston member (30) is slidable in a cylinder (22a) formed in the body (16) and the second piston member (60) is slidable in a cylinder (48a) formed in the first piston member (30). The piston members (30,60) are movable between projecting positions and retracted positions. When both piston members are retracted, the surface (24) of the body (16) is used, when only the second piston member (60) is retracted, the surface (34) of the first piston member (30) is used, and, when neither piston member is retracted, the surface (64) of the second piston member (60) is used.

3 Claims, 3 Drawing Sheets

Fig_1

Fig_2

SUCTION PICK-UP APPARATUS FOR ELECTRICAL OR ELECTRONIC COMPONENTS

This is a continuation of co-pending application Ser. No. 207,362 filed on June 15, 1988, now U.S. Pat. No. 4,852,247.

BACKGROUND OF THE INVENTION

This invention is concerned with suction pick-up apparatus for electrical or electronic components. Such apparatus is used in component placement machines for placing components of varying sizes on a suitable substrate, for example a printed circuit board. Such apparatus comprises one or more pick-up heads movable between a location at which they pick-up a component by suction and a location at which they release the component on to the substrate. Such pick-up heads have pick-up surfaces against which the component is held and for accurate placement it is essential that the size of the pick-up surface at least approximately corresponds to the size of the component. If the pick-up surface is too small the placement force cannot be uniformly applied thereto by the head and the component may tip. If, on the other hand, the pick-up surface is too large, the component cannot be readily centred on the surface and the size of the pick-up surface may restrict access to parts of the substrate because of the possibility of fouling already placed components.

In order to match the pick-up surface to the component, pick-up heads have been constructed with replaceable tips. A magazine of tips with pick-up surfaces of different sizes is provided and, when a component of a different size is to be placed, the pick-up head is moved to the magazine and a tip exchange takes place. This reduces the productivity of the machine. It is also possible to utilise a plurality of alternative pick-up heads each with a different size of pick-up surface but this would be expensive and complex.

The specification of GB Patent Application No. 8702618 describes a suction pick-up apparatus in which pairs of alternative pick-up heads are mounted on carriers spaced around a carousel. The carousel turns to bring the carriers to component pick-up and placement locations and the carriers can be moved relative to the carousel to bring either of the alternative pick-up heads into operation. The pick-up heads on each carrier each have two alternative pick-up surfaces. A first pick-up surface is formed on a body of the pick-up head and a second pick-up surface is formed on a piston member which can project beyond the body or can be retracted into a cylinder within the body. The piston member is retracted when vacuum is applied to the cylinder and projects when air under pressure is applied thereto. It has been found that substantially all the components it is desired to place can be placed using one or other of the pick-up surfaces of one pick-up or other of the pick-up heads.

It is an object of the present invention to provide a pick-up head which can pick-up and place substantially all the components required to be placed in a placement machine without requiring tip exchanges.

BRIEF SUMMARY OF THE INVENTION

The invention provides suction pick-up apparatus for electrical or electronic components, comprising a pick-up head comprising a body having a first pick-up surface at one end portion thereof, a first cylinder within the body, a first piston member mounted for sliding movement in the first cylinder and terminating with a tip having a second pick-up surface of smaller area than the first pick-up surface, the first piston member being slidable between a projecting position thereof in which its tip projects through an opening in the first pick-up surface beyond the first pick-up surface and a retracted position thereof in which the tip of the first piston member does not project beyond the first pick-up surface, a first port extending through the body through which air can be admitted to the first cylinder to drive the first piston member into its projecting position or through which vacuum can be applied to retract the first piston member into its retracted position, a second cylinder within the first piston member, a second piston member mounted for sliding movement in the second cylinder and terminating with a tip having a third pick-up surface of smaller area than the second pick-up surface, the second piston member being slidable between a projecting position thereof in which its tip projects through an opening in the second pick-up surface beyond both the first and the second pick-up surfaces and a retracted position thereof in which the tip of the second piston member does not project beyond the second pick-up surface, a second port extending through the first piston member through which air can be admitted to the second cylinder to drive the second piston member into its projecting position or through which vacuum can be applied to retract the second piston member into its retracted position, and a vacuum port through which component-retaining vacuum can be applied to an opening in the third pick-up surface when the first and the second piston members are in their projecting positions, to the opening in the second pick-up surface when the first piston member is in its projecting position and the second piston member is in its retracted position, and to the opening in the first pick-up surface when the first piston member is in its retracted position.

In a suction pick-up apparatus according to the last preceding paragraph, it is found that with suitable design of the sizes of the pick-up surfaces, substantially all the components desired can be picked-up and placed by the pick-up head without requiring tip exchanges or the provision of alternative pick-up heads.

Preferably, said vacuum port extends through the body and communicates, when the first piston member is in its retracted position with a first annular passage between the body and the first piston member which communicates with the opening in the first pick-up surface, said vacuum port communicating, when the first piston member is in its projecting position with a second annular passage between the body and the first piston member which communicates, when the second piston member is in its retracted position, with the opening in the second pick-up surface and, when the second piston member is in its projecting position, with the opening in the third pick-up surface. This arrangement allows the use of a single vacuum port.

Preferably, said first piston member is retained within said first cylinder by a transversely-extending member fixed to the first piston member and entering a longitudinally-extending slot in said body. This arrangement simplifies the construction. Conveniently, the said transversely-extending member is in the form of a pipe forming said second port.

Conveniently, said second piston member is retained within said second cylinder by a sliding connection with said first piston member. Said sliding connection may comprise a shaft fixed to said first piston member and projecting into a passage in said second piston member, a head formed on said shaft within said passage, and abutment means mounted on said second piston member and arranged to project into said passage to retain said head in said passage.

It is found that a suction apparatus according to the invention can pick-up and place substantially all required components if the first pick-up surface is circular and has a diameter of between 1.5 and 2 millimeters, the second pick-up surface is circular and has a diameter of between 5.5. and 6.5 millimeters, and the third pick-up surface is circular and has a diameter of between 12.5 and 13.5 millimeters.

BRIEF DESCRIPTION OF THE DRAWINGS

There now follows a detailed description, to be read with reference to the accompanying drawings, of a suction pick-up apparatus for electrical or electronic components which is illustrative of the invention. It is to be understood that the illustrative apparatus has been selected for description by way of example and not of limitation of the invention.

In the drawings.

DETAILED DESCRIPTION OF PREFERRED EMBODIMENT OF THE INVENTION

Figure 1:
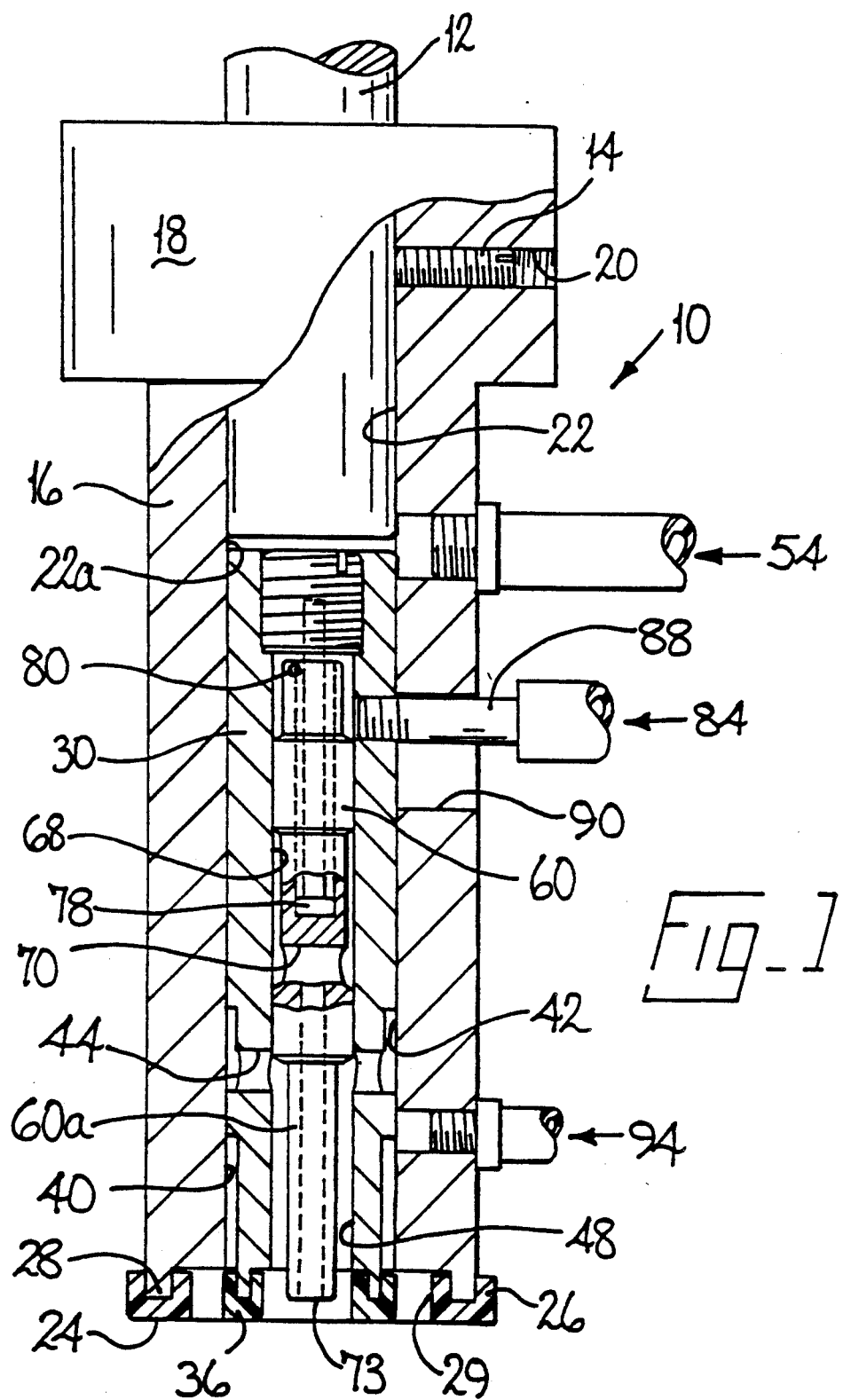
FIG. 1 is an enlarged side elevational view, partly in section, of a pick-up head of the illustrative apparatus, showing the pick-up head in condition for picking-up and placing large components.

The illustrative pick-up apparatus is for electrical or electronic components and comprises a pick-up head 10, a plunger 12 on which the head 10 is fixedly-mounted by a clamping screw 14, means (not shown) for moving the plunger 12 and hence the head 10 up or down to pick-up or place a component (said moving means being of conventional construction e.g. a piston and cylinder assembly); and means (not shown) for moving the plunger 12 and hence the head 14 between a pick-up position at which the head 10 can pick-up a component and a placement position above a substrate on to which the component is to be placed (said means being of conventional construction, e.g. a carousel on which the plunger is mounted).

The pick-up head 10 comprises a body 16 which is generally cylindrical but with an external flange 18 at an upper end portion thereof. The clamping screw 14 is threadedly-received in a threaded bore 20 in said flange 18. A cylindrical passage 22 passes vertically through the body 16 and is entered by the bore 20. A lower portion of the plunger 12 is received in an upper portion of the passage 22 and is (as aforementioned) clamped by the clamping screw 20. The body 16 has a first pick-up surface 24 of the head 10 formed at one end portion thereof, the surface 24 being formed by a resilient washer 26 mounted on a downward annular projection 28 of the body 16, the projection 28 being concentric with the passage 22. The washer 26 has a circular opening 29 therethrough.

The portion of the passage 22 below the plunger 12 forms a first cylinder 22a of the head 10 within the body 16. A first piston member 30 of the head 10 is mounted for sliding movement, up and down, in the first cylinder 22a and terminates at its lower end with a tip having a second pick-up surface 34 of smaller area than the first pick-up surface 24. The second pick-up surface is formed by a resilient washer 36 mounted on a downward annular projection 38 of the first piston member 30, the projection 38 being concentric with the projection 28 of the body 16 and with the passage 22. The washer 36 has a circular opening 37 therethrough. The first piston member 30 is slidable between a projecting position thereof (shown in FIG. 2) in which its tip projects through the opening 29 in the washer 28 beyond the first pick-up surface 24, and a retracted position of the first piston member 30 (shown in FIG. 1) in which the tip does not project beyond the first pick-up surface 24.

The first piston member 30 is generally cylindrical and is a snug fit in the passage 22. The lowermost portion 30a of the member 30 is of reduced diameter so that an annular passage 40 is formed between the body 16 and the member 30. The portion 30b of the member 30 immediately above the portion 30a is a snug fit in the passage 22 so that the upper end of the passage 40 is substantially sealed. The portion 30c of the member 30 immediately above the portion 30b is of reduced diameter so that an annular passage 42 is formed between the body 16 and the member 30, the passage 42 being substantially sealed at its upper and lower ends by portions of the member 30 which are a snug fit in the passage 22. A transverse passage 44 extends radially through the portion 30c and communicates at both ends with the passage 42. The first piston member 30 also has a cylindrical passage 48 passing longitudinally therethrough, the passage 48 being concentric with the passage 22. An upper portion 50 of the passage 48 is of increased diameter and is threaded. A plug 52 is threadedly received in the portion 50 and seals the upper end of the passage 48.

A first port 54 extends through the body 16 into the passage 48 above the first piston member 30. The port 54 comprises a radial threaded bore 56 in the body 16 into which a pipe connection 58 is screwed. Through the first port 54, air can be admitted to the first cylinder 22a to drive the first piston member 30 into its projecting position or vacuum can be applied to suck the first piston member 30 into its retracted position.

The portion of the passage 48 below the plug 52 forms a second cylinder 48a of the head 10 within the first piston member 30. A second piston member 60 is mounted for sliding movement up and down in the second cylinder 48a and terminates at its lower end with an annular tip having a third pick-up surface 64 of smaller area than the second pick-up surface 34. The second piston member 60 is slidable, up and down, in the second cylinder 48a between a projecting position thereof (shown in FIG. 3) in which its tip projects through the opening 37 in the second pick-up surface 34 beyond both the first and the second pick-up surfaces 24 and 34, and a retracted position thereof (shown in FIGS. 1 and 2) in which the tip of the second piston member 60 does not project beyond the second pick-up surface 34.

The second piston member 60 has a lowermost portion 60a of reduced diameter. The portion 60a terminates with the tip of the piston member 60. An annular passage 66 is formed between the portion 60a and the first piston member 30. Immediately above the portion 60a thereof, the piston member 60 has a portion 60b which is a snug fit in the passage 48 and substantially seals the upper end of the passage 66. Immediately above the portion 60b thereof, the piston member 60 has a portion 60c of reduced diameter so that an annular passage 68 is formed by the portion of the passage 48 between the portion 60c and the first piston member 30. A transverse passage 70 extends radially through the portion 60c and communicates at both ends with the passage 68. Immediately above the portion 60c thereof, the piston member 60 has a portion 60d which is a snug fit in the passage 48 and substantially seals the upper end of the passage 68. Immediately above the portion 60d thereof, the piston member 60 has an upper portion 60e of reduced diameter. A longitudinal passage 72 extends upwardly in the second piston member 60 from an opening 73 in the third pick-up surface 64. The passage 72 extends upwardly therein, and communicates with the transverse passage 70. A further longitudinal passage 74 enters the second piston member 60 through the upper surface of the upper portion 60e thereof and extends downwardly through the portion 60d into the portion 60c but without communicating with the passages 70 and 72. A shaft 76 mounted on the plug 52 extends downwardly into the passage 74 and has an enlarged head 78 within the passage 74 which is a sliding fit in the passage 74. A transverse pin 80 set in the portion 60e extends across the passage 74 so that the head 78 cannot leave the passage 74. The pin 80, thus, forms abutment means mounted on the second piston member 60 and arranged to project into the passage 74 to retain the head 78 in the passage 74.

The head 10 also comprises a second port 84, extending through the first piston member 30, through which air can be admitted to the second cylinder 48a to drive the second piston member 60 into its projecting position or through which vacuum can be applied to suck the second piston member into its retracted position. The second port 84 comprises a transverse threaded bore 86 in the first piston member 30, and a metal pipe 88 threadedly-received in the bore 86 and extending through a longitudinal slot 90 in the body 16.

Figure 2:
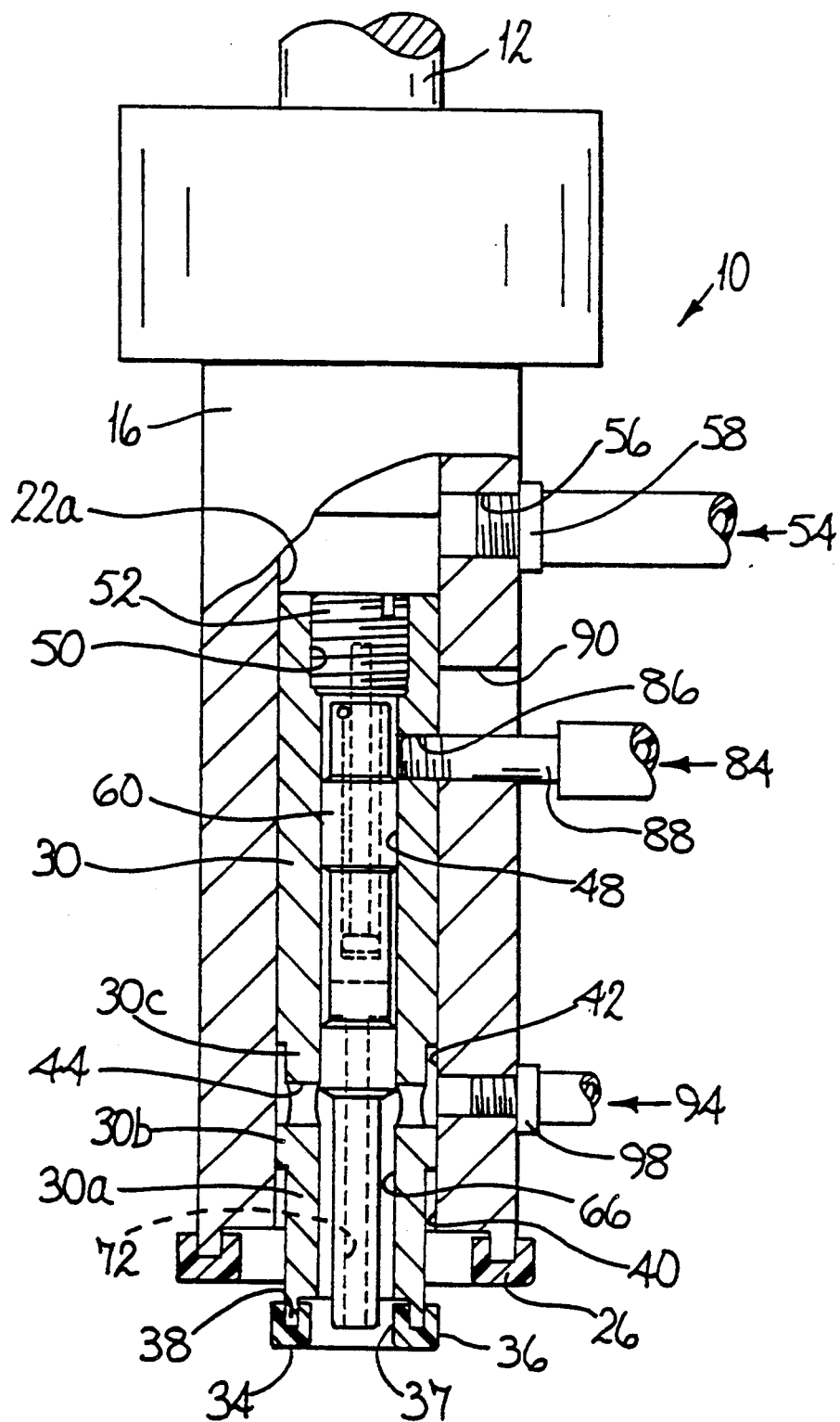
FIG. 2 is a similar view to FIG. 1 but showing the pick-up head in condition for picking-up and placing medium-sized components.

The head 10 also comprises a vacuum port 94 through which component-retaining vacuum can be applied to the opening 73 of the passage 72 in the third pick-up surface 64 when the first and the second piston members 30 and 60 are in their projecting positions (FIG. 3), to the opening 37 in the second pick-up surface 34 when the first piston member 30 is in its projecting position and the second piston member 60 is in its retracted position (FIG. 2), and to the opening 29 in the first pick-up surface 24 when the first piston member 30 is in its retracted position (FIG. 1).

The vacuum port 94 comprises a radial threaded bore 96 in the body 16 and a pipe connection 98 threadedly-received in the bore 96. The port 94, thus, extends through the body 16. The bore 96 enters the passage 22 below the portion 30b and communicates, when the first piston member 30 is in its retracted position (FIG. 1) with the annular passage 40 which communicates with the opening 29 in the first pick-up surface 24. When the first piston member 30 is in its projecting position (FIGS. 2 and 3), the vacuum port 94 enters the passage 22 above the portion 30b and communicates instead with the annular passage 42. When the second piston member 60 is in its retracted position (FIG. 2), the annular passage 42 communicates via the transverse passage 44 with the annular passage 66 which in turn communicates with the opening 37 in the second pick-up surface 34. When the second piston member 60 is in its projecting position (FIG. 3), the annular passage communicates, via the transverse passage 44, the annular passage 68, and the transverse passage 70, with the passage 72 which communicates with the opening 73 in the third pick-up surface 64.

The first piston member 30 is retained within the first cylinder 22a by the pipe 88 which forms a transversely-extending member fixed to the first piston member 30 and entering the longitudinally extending slot 90 in the body 16. The slot 90, thus, limits the movement of the first piston member 30 relative to the body 16 and thereby determines the retracted and projecting positions of the member 30. The second piston member 60 is retained within said second cylinder 48a by the sliding connection with the fist piston member 30 formed by the head 78 of the shaft 76 sliding in the passage 74. Engagement of the head 78 with bottom of the passage 74 and with the pin 80 limits the movement of the second piston member 60 relative to the first piston member 30 and thereby determines the retracted and projecting positions of the member 60.

Figure 3:
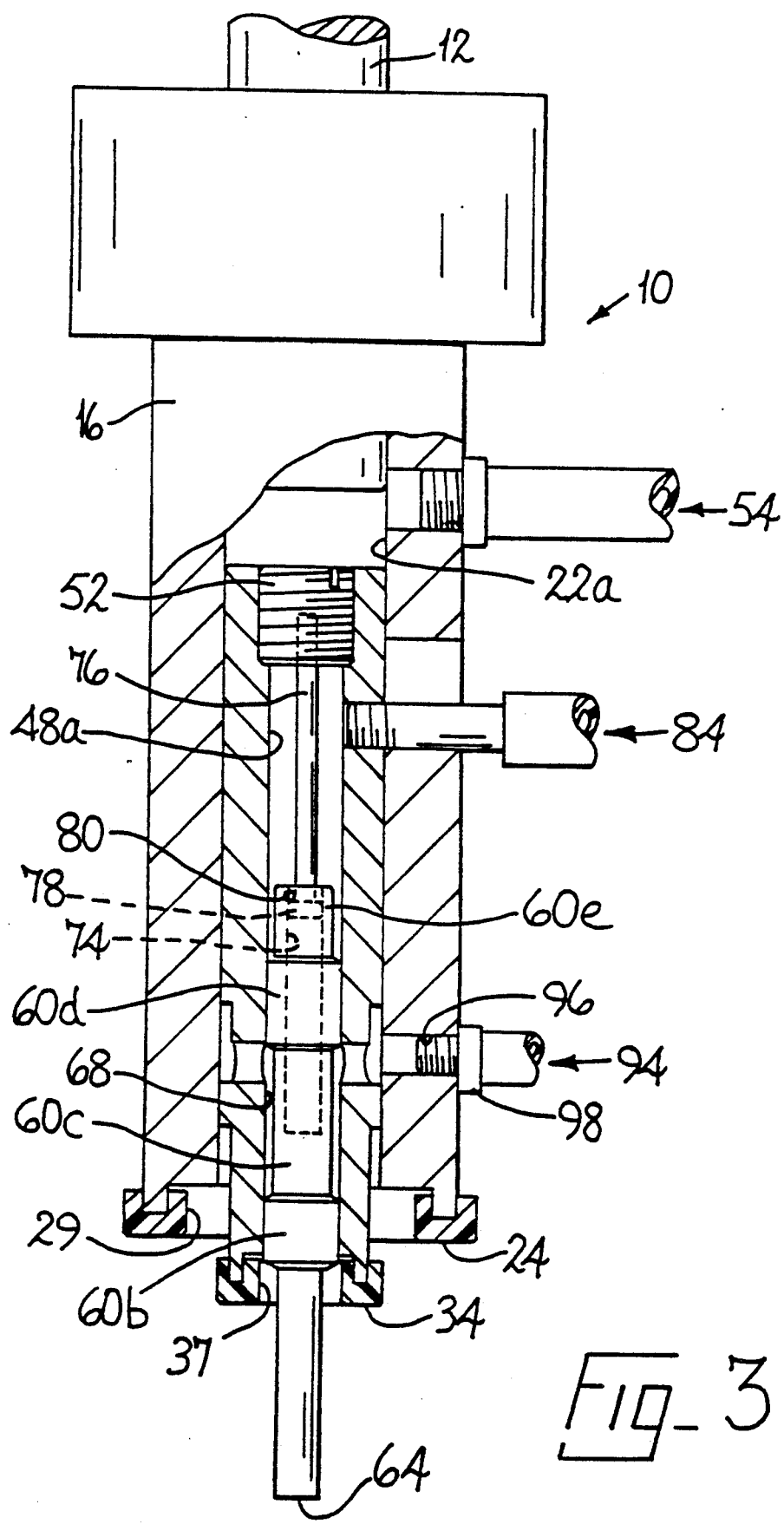
FIG. 3 is a similar view to FIGS. 1 and 2 but showing the pick-up head in condition for picking-up and placing small components.

In the operation of the illustrative pick-up apparatus, when it is desired to pick-up and place a large component, vacuum is applied to all three ports 54, 84 and 94. This sucks the first and second piston members 30 and 60 into their retracted positions (as shown in FIG. 1). The component can now be picked up on the first pick-up surface 24, by vacuum applied to the opening 29, and placed with a short blast of air applied to the port 94 ensuring release from the surface 24. When it is desired to pick-up and place a medium sized component, vacuum is applied to the ports 84 and 94 while air under pressure is applied to the port 54. This blows the first piston member 30 into its projecting position (FIG. 2) with the second piston member 60 moving with the first piston member but remaining in its retracted position relative to the first piston member 30. During this movement, the pipe 88 moves from the top to the bottom of the slot 90. The second pick-up surface 34 is now proud of the first pick-up surface 24 and the component can now be picked up on the surface 34 by the vacuum which is now being applied to the opening 37. When it is desired to pick-up and place a small component, vacuum is applied to the port 94 while air under pressure is applied to the ports 54 and 84. This blows both the first piston member 30 and the second piston member 60 into their projecting positions (FIG. 3). The third pick-up surface 64 is now proud of both the surfaces 24 and 34 and the component can be picked up by the vacuum which is now being applied to the opening 73.

I claim:

1. A pick-up head for picking up electronic components comprising a body having an annular pick-up surface at the bottom thereof defining a first suction area and a vertical blind bore extending upwardly from said first suction area, a first piston member slidably displacable within said bore between selected upper and lower positions and having top portion for sealing said bore, a second annular pick-up surface at the bottom thereof defining a second smaller suction area and a vertical blind bore extending upwardly from said second area, a second piston member slidably displaceable within said first piston bore between selected upper and lower positions, and having a top portion for sealing said bore, a third annular pick-up surface at the bottom thereof defining a third yet smaller suction area and a vertical blind bore extending upwardly from said third area, conduit means extending through said body communicating with said body bore above said first piston member and means for connecting a pressure or vacuum source to said second piston member including an enlarged opening in said body, pipe means passing through said enlarged opening and through said first piston member below the top portion thereof and above said second piston member, said enlarged area having a size selected so that said first piston member carrying said pipe means can be displaced between said first piston member upper and lower positions.

2. A pick-up head according to claim 1 wherein said enlarged opening means comprises stop means for limiting the upward and downward movement of said first piston element.

3. A pick-up head according to claim 2 further comprising stop means for limiting the upward and downward movement of said second piston element relative to said first piston element.

* * * * *